United States Patent [19]

Ohashi

[11] Patent Number: 5,018,154

[45] Date of Patent: May 21, 1991

[54] SEMICONDUCTOR LASER DRIVE DEVICE

[75] Inventor: Tsuyoshi Ohashi, Hashima, Japan

[73] Assignee: Brother Kogyo Kabushiki Kaisha, Aichi, Japan

[21] Appl. No.: 578,270

[22] Filed: Sep. 6, 1990

[30] Foreign Application Priority Data

Sep. 12, 1989 [JP] Japan .................................. 1-237585
Oct. 5, 1989 [JP] Japan .................................. 1-261833

[51] Int. Cl.⁵ .............................................. H01S 3/131
[52] U.S. Cl. ........................................ 372/29; 372/31; 372/33; 372/34; 372/38
[58] Field of Search .................... 372/29, 31, 32, 33, 372/34, 26, 38

[56] References Cited

U.S. PATENT DOCUMENTS 4,796,266 1/1989 Banwell et al. .................... 372/38
4,817,098 3/1989 Horikawa ......................... 372/29
4,819,241 4/1989 Nagano .......................... 372/38
4,884,279 11/1989 Odagiri .......................... 372/29

Primary Examiner—Frank Gonzalez
Assistant Examiner—Galen J. Hansen
Attorney, Agent, or Firm—Oliff & Berridge

[57] ABSTRACT

A semiconductor laser drive device modulates optical output of a semiconductor laser in accordance with an externally provided modulation signal comprises a compensation circuit for calculating a compensation coefficient and for generating a compensation modulation signal, a threshold value current generation circuit for generating and a threshold value current to the compensation modulation signal and sending the added current as a drive current, and a current drive circuit for driving the semiconductor laser based on the drive current sent from the threshold value current generation circuit. In accordance with the semiconductor laser, the optical output error caused by the temperature change of the semiconductor laser is compensated.

21 Claims, 4 Drawing Sheets

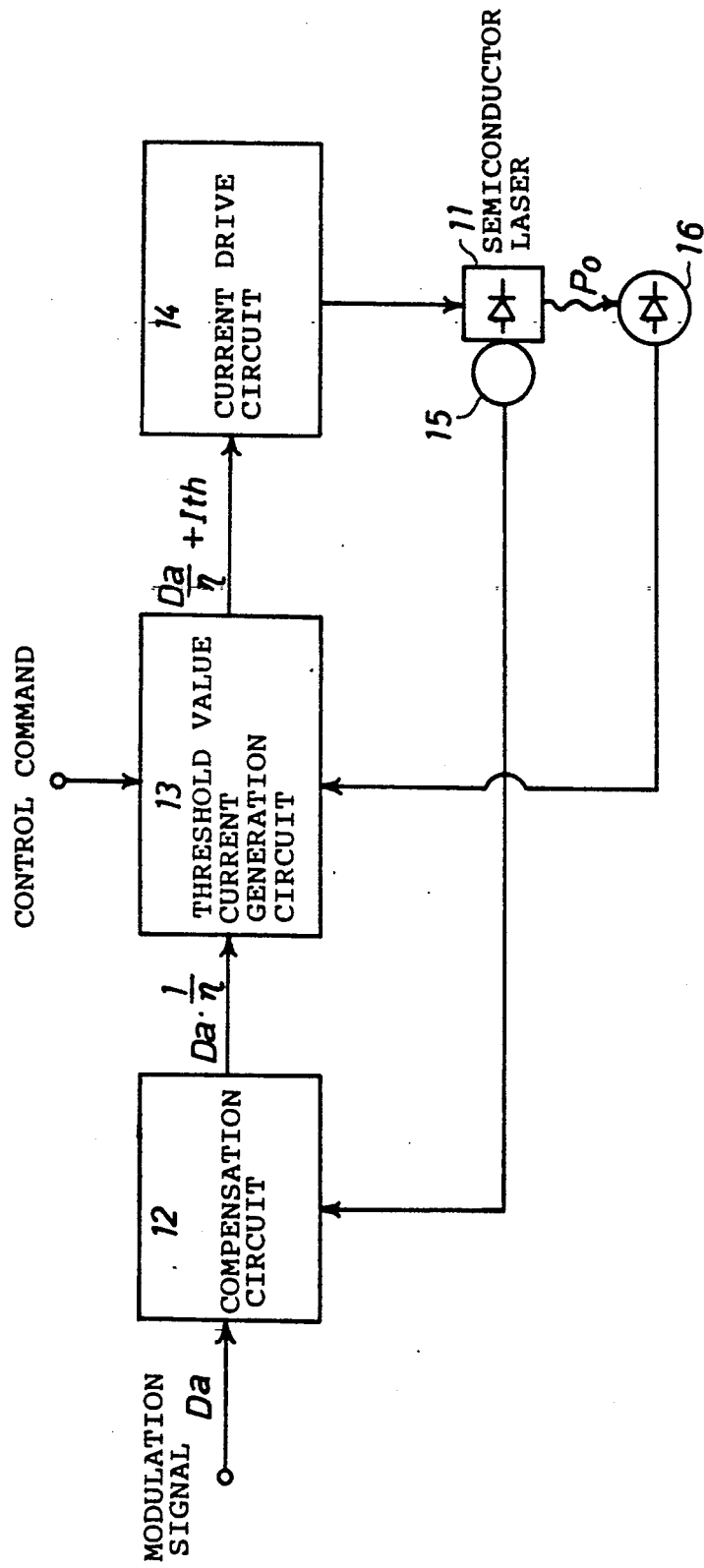

SEMICONDUCTOR LASER DRIVE DEVICE

BACKGROUND OF THE INVENTION

The present invention relates to a semiconductor laser drive device used in exposure apparatuses. More particularly, the present invention relates to a semiconductor laser drive device which modulates the intensity of a laser beam corresponding to an externally provided digital modulation signal.

Related Art

In a semiconductor laser drive device which electrically drive a semiconductor laser based on an analog control signal converted from an externally provided digital modulation signal and modulates the intensity of optical output of the semiconductor laser, various measurements are taken in order to minimize the error of the optical output caused by temperature change of the semiconductor laser. Such measures include, for instance, temperature control by keeping the temperature of the semiconductor laser constant and threshold value current compensation in which a threshold value current, which changes in accordance with the temperature change of the semiconductor laser, is detected and the operating point of the semiconductor is accordingly adjusted.

The above temperature control of a semiconductor laser is effected by heating a semiconductor laser or storing a semiconductor in a constant temperature oven. However, since this measure is incapable of accurate temperature control and not a reliable measure, the other measure, threshold value current compensation is ordinarily adopted to minimize an error.

A semiconductor laser drive device provided with a mechanism to compensate a threshold value current detects change in the threshold value current by monitoring the optical output of a semiconductor laser using a photodetective element such as a photodiode. Then, the semiconductor laser drive device controls the drive current of the semiconductor laser based on the detected change in the threshold value current and compensates for the change, thus minimizing the error of the optical output corresponding to a digital modulation signal even though the threshold value current changes due to the temperature change of the semiconductor laser.

As explained above, the optical output change is caused by threshold value current change which in turn is caused by the temperature change of a semiconductor laser. Moreover, external differential quantum efficiency which is the luminous efficiency of a semiconductor laser (referred to as slope efficiency hereinafter) also changes corresponding to the temperature change.

FIG. 3 shows the relation between the optical output P of a semiconductor laser and the drive current $I_F$. If the threshold value current is $I_{th}$ at a certain temperature and slope efficiency, which is the ratio of an increase of the drive current $I_F$ to an increase of the optical output P, is $\eta$, P is expressed as follows:

$$P = (I_F - I_{th})\eta \quad (1)$$

As shown in FIG. 4, the change in slope efficiency is known to be in approximate proportion to the change in temperature. Therefore, in a semiconductor laser drive device which modulates the optical output of a semiconductor laser corresponding to an externally provided digital modulation signal, compensation of threshold value current alone does not solve the problem of an error of the optical output occurring due to a change of slope efficiency caused by the temperature change. More specifically, as shown in the above equation (1), when the temperature of a semiconductor rises, slope efficiency decreases, thus reducing the optical output. On the other hand, when the temperature lowers, slope efficiency increases, thus increasing the optical output. The variable slope efficiency has made it difficult to obtain stable optical output which is in proportion to an externally provided digital modulation signal.

SUMMARY OF THE INVENTION

The object of the present invention made to overcome the above-identified problem is to provide a semiconductor laser drive device that can stably modulate the output of a semiconductor laser without causing an output error by compensating change in threshold value current and slope efficiency caused by temperature change of the semiconductor laser.

The present invention attains the above-mentioned object by adding a slope efficiency compensation means to a semiconductor laser drive device provided with a threshold value current compensation means.

A semiconductor laser drive device of the first embodiment of the present invention comprises: a D/A conversion circuit for converting an externally provided digital modulation signal to an analog signal based on a reference voltage; a current drive circuit for electrically driving a semiconductor laser based on the output signal sent from the D/A conversion circuit; and a threshold value current generation circuit for generating a threshold value current of the semiconductor laser based on which the drive current of the semiconductor laser is compensated. The semiconductor laser further is also provided with a reference voltage compensation means for calculating a compensation coefficient, which is the reciprocal of the slope efficiency, based on the temperature information of the semiconductor laser and compensating the reference voltage of the D/A conversion circuit with the compensation coefficient.

In operation, the threshold value current generation circuit reduces the error in optical output modulation caused by change in the threshold value current while the reference voltage compensation means reduces the error in optical output modulation caused by changes in slope efficiency. Consequently, the optical output of a semiconductor laser can be accurately modulated in proportion to an externally provided digital modulation signal.

A semiconductor laser drive device of a second embodiment of the present invention is provided with a threshold value current compensation means for compensating change in the threshold value current and a slope coefficient compensation means for compensating change in slope efficiency. More particularly, a semiconductor laser drive device of the second embodiment that modulates optical output of a semiconductor laser in accordance with an externally provided modulation signal comprises: a compensation circuit for calculating a compensation coefficient, which is the reciprocal of slope efficiency, based on the temperature of the semiconductor laser and for generating a compensation modulation signal obtained by multiplying the externally provided modulation signal by the compensation coefficient; a threshold value current generation circuit for generating and a threshold value current to the compensation modulation signal and sending the added current as a drive current; and a current drive circuit for driving the semiconductor laser based on the drive current sent from the threshold value current generation circuit.

In the operation of the semiconductor laser drive circuit of the second embodiment, the compensation circuit sends a compensation modulation signal which has been compensated for the change in slope efficiency due to the temperature change of a semiconductor laser to the threshold value current generation circuit. The threshold value current generation circuit drives the semiconductor laser by sending a drive current which is the addition of a threshold value current variable to the temperature change and the compensation modulation signal. Then, the semiconductor laser is driven to generate the optical output in proportion to the modulation signal which has been compensated for slope efficiency and threshold value current. In other words, the semiconductor laser accurately generates the optical output without making little error caused by the temperature change.

BRIEF EXPLANATION OF THE ATTACHED DRAWINGS

FIG. 5 is a block diagram of a semiconductor laser drive device of a second embodiment of the present invention.

DETAILED DESCRIPTION OF THE PREFERRED EMBODIMENTS

First Embodiment

Figure 1:
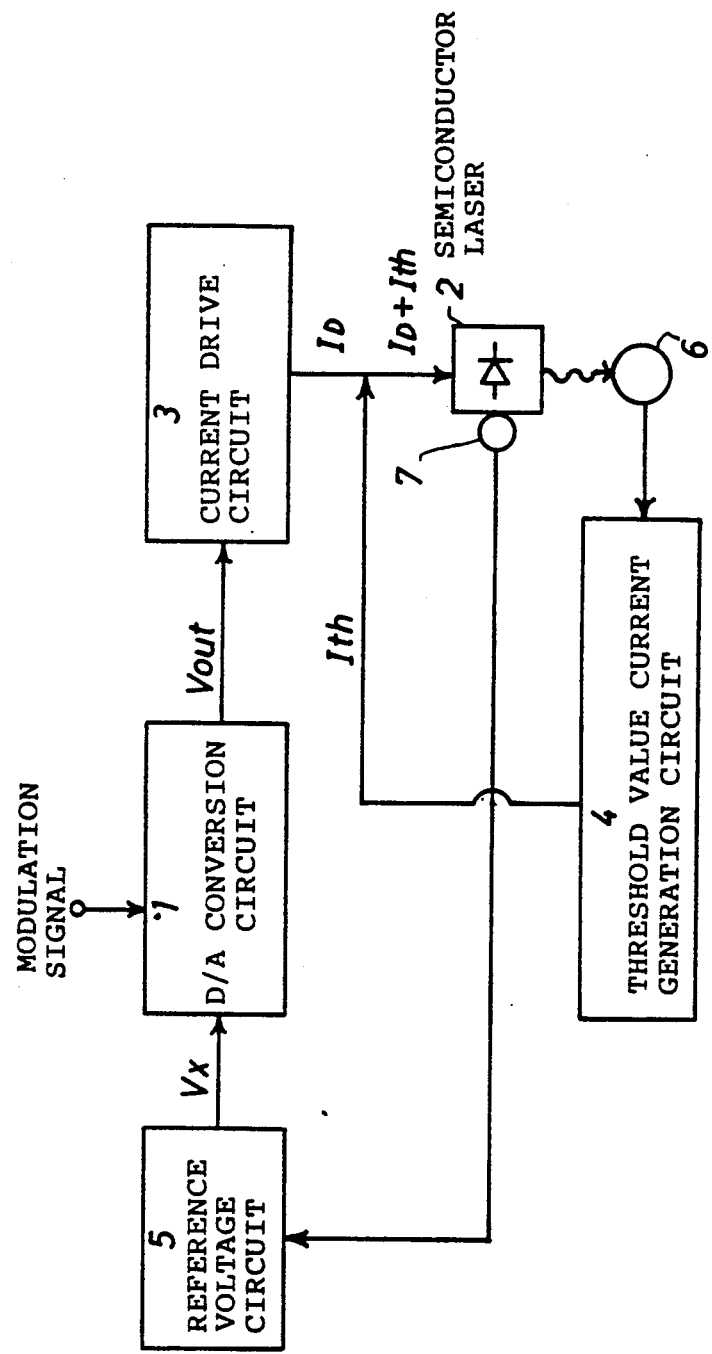
FIG. 1 is a block diagram of a semiconductor laser drive device of a first embodiment of the present invention.

A semiconductor laser embodying the present invention is explained in reference to FIGS. 1 and 2 hereinafter.

As shown in a block diagram of FIG. 1, the semiconductor laser drive device comprises a D/A conversion circuit 1 for converting an externally provided digital modulation signal into an analog signal based on a reference voltage $V_x$, which is explained below, a current drive circuit 3 for electrically driving a semiconductor laser 2 according to an output voltage Vout of the D/A conversion circuit 1, a threshold value current generation circuit 4 for generating a threshold value current of the semiconductor laser 2, and a reference voltage compensation circuit 5 for compensating for change in slope efficiency of the semiconductor laser 2.

The threshold value current generation circuit 4 generates a threshold value current corresponding to the temperature of the semiconductor laser 2 based on a signal sent from a photodetective element, such as photodiode 6, photocoupled with the semiconductor laser 2. Then, the threshold value current generation circuit 4 adds the threshold value current corresponding to the temperature of the semiconductor laser 2 to output current $I_D$, thereby compensating for variations the output of the semiconductor laser 2 caused by change in the threshold value current.

The reference voltage circuit 5 determines a compensation coefficient, which is the reciprocal of slope efficiency, based on the temperature of the semiconductor laser 2 sent in the form of temperature information from a temperature sensor 7 that is thermally coupled with the semiconductor laser 2. The reference voltage circuit 5 compensates a reference voltage $V_o$ with the compensation coefficient and sends a compensation reference voltage $V_x$, which is the compensated reference voltage $V_o$, to the D/A conversion circuit 1.

More detailed explanation of the compensation operation is given below.

Figure 2:
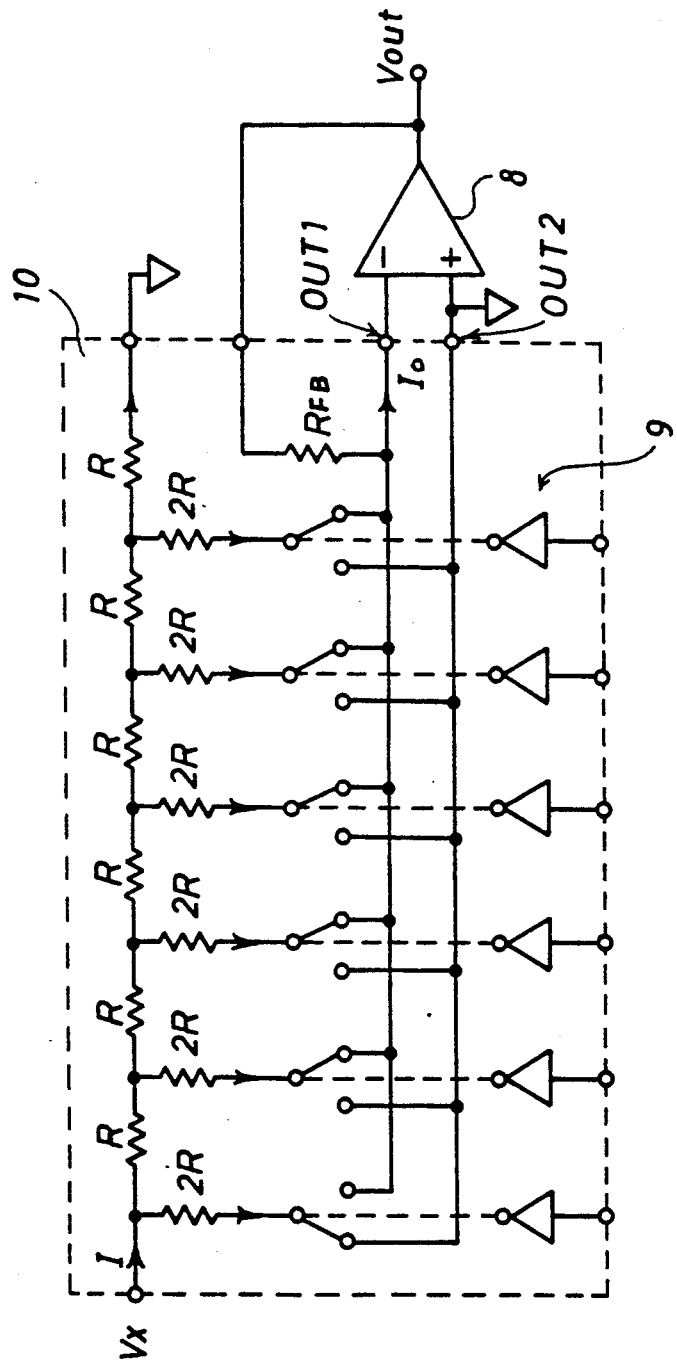
FIG. 2 is a wiring diagram of a D/A conversion circuit included in FIG. 1.

As shown in FIG. 2 explaining the constitution of the D/A conversion circuit 1, an addition circuit 9 provided with operation amplifier 8 uses a ladder-like resistance circuit 10 to receive the compensation reference voltage $V_x$. The resistance circuit 10 is weighted by $2^n$, where n is the number of bits in a digital notation signal code. The compensation reference voltage $V_x$ is applied to the resistance circuit 10.

Therefore, in the resistance circuit 10 of the D/A conversion circuit 1, weighted currents flow through each resistor based on the compensation reference voltage $V_x$ and, if switched on, which is determined by the state of each bit of the digital modulation signal code, combines the currents and generates a composite current $I_o$ therefrom. The current $I_o$, which flows at a terminal OUT1, is expressed by the following equation:

$$I_o = \sum_{n=1}^{6} \tfrac{1}{2}^n \, bn \qquad (2)$$

In the equation (2), I is the input current; and bn is the state of each bit, either 1 or 0.

The output voltage Vout of the D/A conversion circuit 1 is expressed by the following equation:

$$Vout = -R_{FB} \cdot I \cdot \sum_{n=1}^{6} bn/2^n \qquad (3)$$

In the equation (3), $R_{FB}$ is the feedback resistance. In the present circuit, $R_{FB}$ is designed to be R.

Because $V_x = R \, I = R_{FB} \, I$, the equation (3) is expressed by the following equation:

$$Vout = -V_x \cdot \sum_{n=1}^{6} bn/2^n \qquad (4)$$

The output voltage Vout of the D/A conversion circuit 1 is sent to the current drive circuit 3. The output current $I_D$ of the current drive circuit is expressed by the following equation:

$$I_D = K \cdot Vout \qquad (5)$$

In the equation (5), K (a constant) is the drive capacity of the current drive circuit 3; and $I_D$ is the output current.

Figure 3:
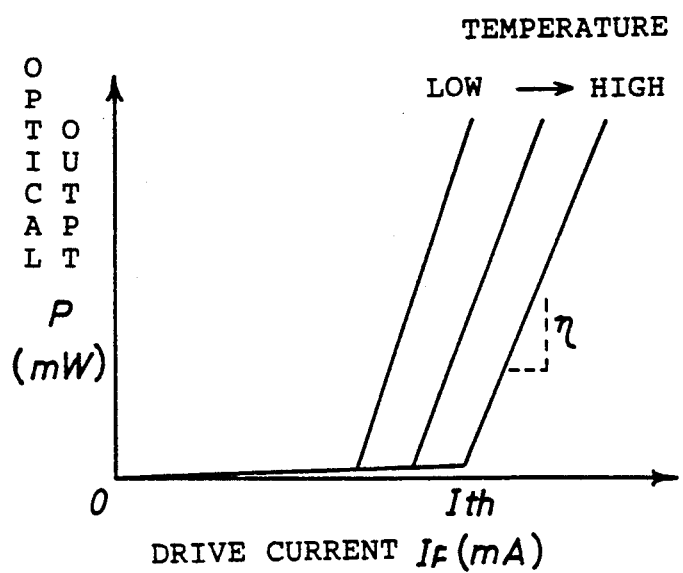
FIG. 3 is a graph showing characteristics of the optical output and the drive current of a semiconductor laser.
Figure 4:
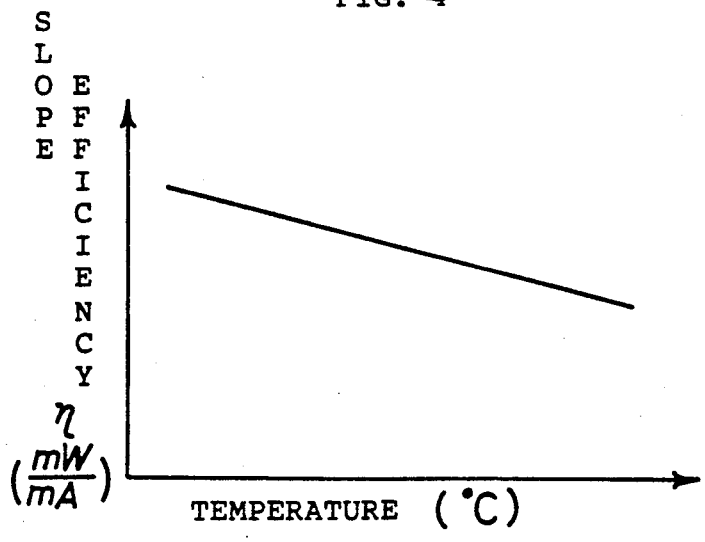
FIG. 4 is a graph showing the relationship between the slope efficiency and the temperature of a semiconductor laser.

The output current $I_D$ is added to the threshold value current $I_{th}$ (see FIG. 3 for reference) to obtain current $I_F$ which is expressed by the following equation:

$$I_F = I_D + I_{th} \qquad (6)$$

The current $I_F$ drives the semiconductor laser 2. As is the equation (1) explained above, the optical output P of the semiconductor laser 2 is expressed by the following equation:

$$P = (I_F - I_{th}) \cdot \eta \qquad (7)$$

In the above equation (7), $\eta$ is the slope efficiency.

The reference value circuit 5 calculates a compensation coefficient which is the reciprocal $1/\eta$ of slope efficiency $\eta$ and determines the compensation reference voltage $V_x$ to be sent to the D/A conversion circuit 1 after compensating the reference voltage $V_o$ by the compensation coefficient. The compensation reference voltage $V_x$ is expressed by the following equation:

$$V_x = -1/\eta \cdot V_o \qquad (8)$$

Therefore, if the right sides of the equations (7) and (5) are substituted for $I_F$ and $I_D$, respectively, in the equation (7), the following equation is obtained:

$$\begin{aligned} P &= (I_D + I_{th} - I_{th})\eta \qquad (9)\\ &= \eta \cdot I_D \\ &= \eta \cdot K\, V_{out} \end{aligned}$$

Furthermore, if the right sides of the equations (4) and (8) are substituted for Vout and $V_x$, respectively, the following equation is obtained:

$$\begin{aligned} P &= \eta \cdot K \cdot (-V_x) \cdot \sum_{n=1}^{6} bn/2^n \qquad (10)\\ &= \eta \cdot K \cdot 1/\eta\, V_o \sum_{n=1}^{6} bn/2^n \\ &= K\, V_o \cdot \sum_{n=1}^{6} bn/2^n \end{aligned}$$

The equation (10) clearly shows that change in either the threshold value current $I_{th}$ or the slope efficiency $\eta$ due to the temperature change of the semiconductor laser 2 does not cause the error of the optical output of the semiconductor laser 2: the semiconductor laser 2 sends accurate optical output in proportion to the externally provided digital modulation signal.

While the described embodiment represents the preferred form of the invention, it is to be understood that changes and variations can be made without departing from the spirit and the scope of the invention.

For example, the added signal of the digital data corresponding to the threshold value current of a semiconductor laser and the digital data of the externally provided modulation signal may be converted to an analog signal by the D/A conversion circuit.

Second Embodiment

A second embodiment of the present invention is explained hereinafter, referring to a block diagram of FIG. 5 showing the overall constitution of the present embodiment of the semiconductor laser drive device.

The semiconductor laser drive device comprises a compensation circuit 12 for compensating an externally provided modulation signal $D_a$ for change in slope efficiency $\eta$ of a semiconductor laser 11, a threshold value current generation circuit 13 for generating a threshold value current of the semiconductor laser 11, a current drive circuit 14 for electrically driving the semiconductor laser 11, a temperature sensor 15 for detecting the temperature of the semiconductor laser 11 and sending a electrically converted signal to the compensation circuit 12, and a photodiode 16, a photodetective element, for converting the optical output of the semiconductor laser 11 to an electrical signal and sending the electrical signal to the threshold value current generation circuit 13. The temperature sensor 15 is thermally coupled with the semiconductor laser 11 and sends information conveying the temperature of the semiconductor laser 11 that determines slope efficiency. The photodiode 16 is photocoupled with the semiconductor laser 11 and sends a signal which determines the threshold value current of the semiconductor laser 11 to the threshold value current generation circuit 13.

The following is a more detailed explanation of the operation of the semiconductor laser drive device of the present embodiment.

The compensation circuit 12 calculates a compensation coefficient $1/\eta$, which is the reciprocal of slope efficiency $\eta$, and generates a compensated modulation signal $D_a 1/\eta$ obtained by multiplying the compensation signal $1/\eta$ by the externally provided modulation signal $D_a$.

The threshold value current generation circuit 13 generates a threshold value current $I_{th}$ corresponding to the temperature of the semiconductor laser 11 based on the signal sent from the photodiode 16 and send a drive current $D_a/\eta + I_{th}$, which is the addition of the generated threshold value current $I_{th}$ and the compensation modulation signal $D_a/\eta$ from the compensation circuit 12, to the current drive circuit 14.

To generate a threshold value current, the threshold value current generation circuit 13 first sends only the threshold value current by blocking the modulation data sent from the compensation circuit 12 upon receiving a control instruction signal externally provided at regular intervals. Second, the threshold value current is gradually raised from zero until the photodiode 16 detects the rapidly increasing optical output of the semiconductor laser 11 reaching a predetermined level. At the predetermined level the threshold value current $I_{th}$ is fixed. Consequently, the block of the modulation data sent from the compensation circuit 12 is removed.

The current drive circuit 14 drives the semiconductor laser 11 based on the drive current $(D_a/\eta + I_{th})$ from the threshold value current generation circuit 13. The optical output P is expressed by the following equation in accordance with the graph of FIG. 3:

$$P = (I_F - I_{th})\eta \qquad (11)$$

In the equation, $I_F$ is the drive current.

If the drive current $D_a/\eta + I_{th}$ of the present embodiment is substituted for $I_F$ in the equation (11), the optical output P is expressed by the following equation:

$$\begin{aligned} P &= (D_a/\eta + I_{th} - I_{th})\eta \qquad (12)\\ &= D_a \end{aligned}$$

As shown in the equation (12), the optical output of the semiconductor 11 is in proportion to the externally provided modulation signal $D_a$, not affected by change in the threshold value current $I_{th}$ or slope efficiency.

As shown in the foregoing explanation, in accordance with the present invention, a threshold value current generation means compensates the optical output for change in a threshold value current cased by temperature change of the semiconductor laser while a slope efficiency compensation means compensates the optical output for change in slope efficiency. Therefore, temperature change of a semiconductor laser does not affect the stable optical output and guarantees accurate, reliable optical output in proportion to externally provided modulation signal. Furthermore, because it is not necessary to keep the temperature of a semiconductor laser constant, size-reduction and weight-reduction can be easily achieved.

What is claimed is:

1. A drive circuit for driving a semiconductor laser, comprising:
   control signal generating means electrically coupled to the semiconductor laser for generating a control signal for driving the semiconductor laser based on an externally provided modulation signal;
   detecting means for detecting a temperature of the semiconductor laser;
   compensating means electrically coupled to the control signal generating means for altering the control signal based on the temperature of the semiconductor laser to compensate for changes in slope efficiency $\eta$ of the semiconductor laser.

2. The drive circuit of claim 1, in which the compensating means compensates for changes in slope efficiency $\eta$ by altering the control signal based on a compensation coefficient $1/\eta$.

3. The drive circuit of claim 2, in which each compensation coefficient $1/\eta$ is predetermined for a plurality of temperatures of the semiconductor laser.

4. The drive circuit of claim 1, in which the compensating means alters the control signal by multiplying the modulation signal by a compensation coefficient $1/\eta$.

5. The drive circuit of claim 1, in which the modulation signal is converted from binary form into an analog signal based on a reference voltage, and the compensating means alters the control signal by multiplying the reference voltage by a compensation value equal to $1/\eta$.

6. The drive circuit of claim 1, in which:
   the control signal comprises a drive current $I_f$ for driving the semiconductor laser; and
   the slope efficiency $\eta$ is the ratio of an increase of the drive current $I_f$ to an increase of an optical output P of the semiconductor laser.

7. The drive circuit of claim 6, in which the relation of the output P of the semiconductor laser to the slope efficiency $\eta$ is given by the following equation:

$$P=(I_f-I_{th})\eta,$$

where $I_{th}$ is a threshold current representing a drive current of the semiconductor laser at which the optical output P of the semiconductor laser rapidly begins to increase.

8. The drive circuit of claim 7, further comprising threshold current determination means for determining the threshold current $I_{th}$.

9. A drive circuit for driving a semiconductor laser, comprising:
   threshold current determination means electrically coupled to the semiconductor laser for determining a threshold current, where the threshold current is a drive current of the semiconductor laser at which the optical output P of the semiconductor laser rapidly begins to increase;
   detecting means for detecting a temperature of the semiconductor laser;
   reference voltage generating means for generating a compensated reference voltage based on a reference voltage and the temperature of the semiconductor laser;
   digital/analog converting means for converting an externally provided modulation signal into an output voltage based on the compensated reference voltage; and
   control current generating means for generating a control current based on the output voltage and the threshold current, where the control current controls an optical output of the semiconductor laser.

10. The drive circuit of claim 9, in which:
    the control current comprises a drive current for driving the semiconductor laser; and
    the slope efficiency $\eta$ is the ratio of an increase of the drive current to an increase of the optical output of the semiconductor laser.

11. The drive circuit of claim 9, in which the reference voltage generating means generates the compensated reference voltage to compensate for changes in slope efficiency $\eta$ of the semiconductor laser.

12. The drive circuit of claim 11, in which the compensating means compensates for changes in slope efficiency $\eta$ by multiplying the reference voltage by a compensation coefficient equal to $1/\eta$.

13. The drive circuit of claim 12, in which each compensation coefficient $1/\eta$ is predetermined for a plurality of temperatures of the semiconductor laser.

14. The drive circuit of claim 13, in which the control current generating means generates the control current by generating a drive current from the output voltage and adding the drive current to the threshold current.

15. The drive circuit of claim 9, in which the threshold current determination means comprises:
    a photodiode for generating an output signal indicating the optical output of the semiconductor laser; and
    a threshold value generation means for generating the threshold current by determining a drive current at which the output signal begins to change rapidly.

16. A drive circuit for driving a semiconductor laser, comprising:
    detecting means for detecting a temperature of the semiconductor laser;
    compensating means for generating an altered modulation signal from an externally provided modulation signal based on the temperature of the semiconductor laser;
    threshold signal determination means for determining a threshold signal and adding the threshold signal to the altered modulation signal to form a control signal, where the threshold signal corresponds to a drive current at which an optical output of the semiconductor laser rapidly begins to increase; and
    drive means for generating a control current based on the control signal, where the control current drives the semiconductor laser to generate an optical output.

17. The drive circuit of claim 16, in which:
    the control current comprises a drive current for driving the semiconductor laser; and the slope efficiency η is the ratio of an increase of the drive current to an increase of the optical output of the semiconductor laser.

18. The drive circuit of claim 17, in which the compensating means generates the altered modulation signal by multiplying the modulation signal by a compensation coefficient equal to 1/η.

19. The drive circuit of claim 18, in which each compensation coefficient 1/η is predetermined for a plurality of temperatures of the semiconductor laser.

20. The drive circuit of claim 19, in which the threshold signal determination means determines the threshold signal by generating a plurality of test threshold signals, generating a plurality of corresponding test control signals only from the test threshold signals, and setting the threshold signal equal to the test threshold signal for which the optical output of the semiconductor laser approximates a predetermined value.

21. The drive circuit of claim 16, in which the threshold current determination means comprises:
 a photodiode for generating an output signal indicating the optical output of the semiconductor laser; and
 a threshold value generation means for generating the threshold current by determining a drive current at which the output signal begins to change rapidly.

* * * * *